United States Patent [19]
Mitlitsky et al.

[11] Patent Number: 5,714,404
[45] Date of Patent: *Feb. 3, 1998

[54] FABRICATION OF POLYCRYSTALLINE THIN FILMS BY PULSED LASER PROCESSING

[75] Inventors: Fred Mitlitsky, Livermore; Joel B. Truher, San Rafael; James L. Kaschmitter, Pleasanton; Nicholas J. Colella, Livermore, all of Calif.

[73] Assignee: Regents of the University of California, Oakland, Calif.

[*] Notice: The term of this patent shall not extend beyond the expiration date of Pat. No. 5,346,850.

[21] Appl. No.: 154,347

[22] Filed: Nov. 18, 1993

[51] Int. Cl.$^6$ .............................. H01L 31/18; H01L 31/04
[52] U.S. Cl. ............................. 437/233; 437/173; 437/4
[58] Field of Search ........................... 437/233, 173, 437/101, 109, 2, 4; 257/75, 49, 51; 148/DIG. 1, DIG. 90, DIG. 93, DIG. 122; 117/4, 7, 904; 136/261

[56] References Cited

U.S. PATENT DOCUMENTS

| | | | |
|---|---|---|---|
| 4,639,277 | 1/1987 | Hawkins | 148/DIG. 56 |
| 5,061,655 | 10/1991 | Ipposhi et al. | 117/904 |
| 5,085,939 | 2/1992 | Wenz et al. | 156/643 |
| 5,180,690 | 1/1993 | Czubatyj et al. | 148/DIG. 1 |
| 5,221,365 | 6/1993 | Noguchi et al. | 136/261 |
| 5,225,371 | 7/1993 | Sexton et al. | 437/173 |
| 5,242,507 | 9/1993 | Iverson | 437/233 |
| 5,286,306 | 2/1994 | Menezes | 136/249 |
| 5,294,567 | 3/1994 | Dorfman et al. | 148/DIG. 93 |
| 5,346,850 | 9/1994 | Kaschmitter et al. | 437/81 |
| 5,372,836 | 12/1994 | Imahashi et al. | 437/17.3 |
| 5,413,958 | 5/1995 | Imahashi et al. | 437/17.3 |
| 5,427,961 | 6/1995 | Takenouchi et al. | 437/2 |
| 5,456,763 | 10/1995 | Kaschimitter et al. | 437/173 |

OTHER PUBLICATIONS

I.P. Herman, Laser–Assisted Deposition of Thin Films from Gas–Phase and Surface–Adsorbed Molecules, Chem. Rev. 1989, 89, pp. 1323–1357.

*Primary Examiner*—Tom Thomas
*Assistant Examiner*—S. Mulpuri
*Attorney, Agent, or Firm*—L. E. Carnahan; Henry P. Sartorio

[57] ABSTRACT

A method for fabricating polycrystalline thin films on low-temperature (or high-temperature) substrates which uses processing temperatures that are low enough to avoid damage to the substrate, and then transiently heating select layers of the thin films with at least one pulse of a laser or other homogenized beam source. The pulse length is selected so that the layers of interest are transiently heated to a temperature which allows recrystallization and/or dopant activation while maintaining the substrate at a temperature which is sufficiently low to avoid damage to the substrate. This method is particularly applicable in the fabrication of solar cells.

18 Claims, 1 Drawing Sheet

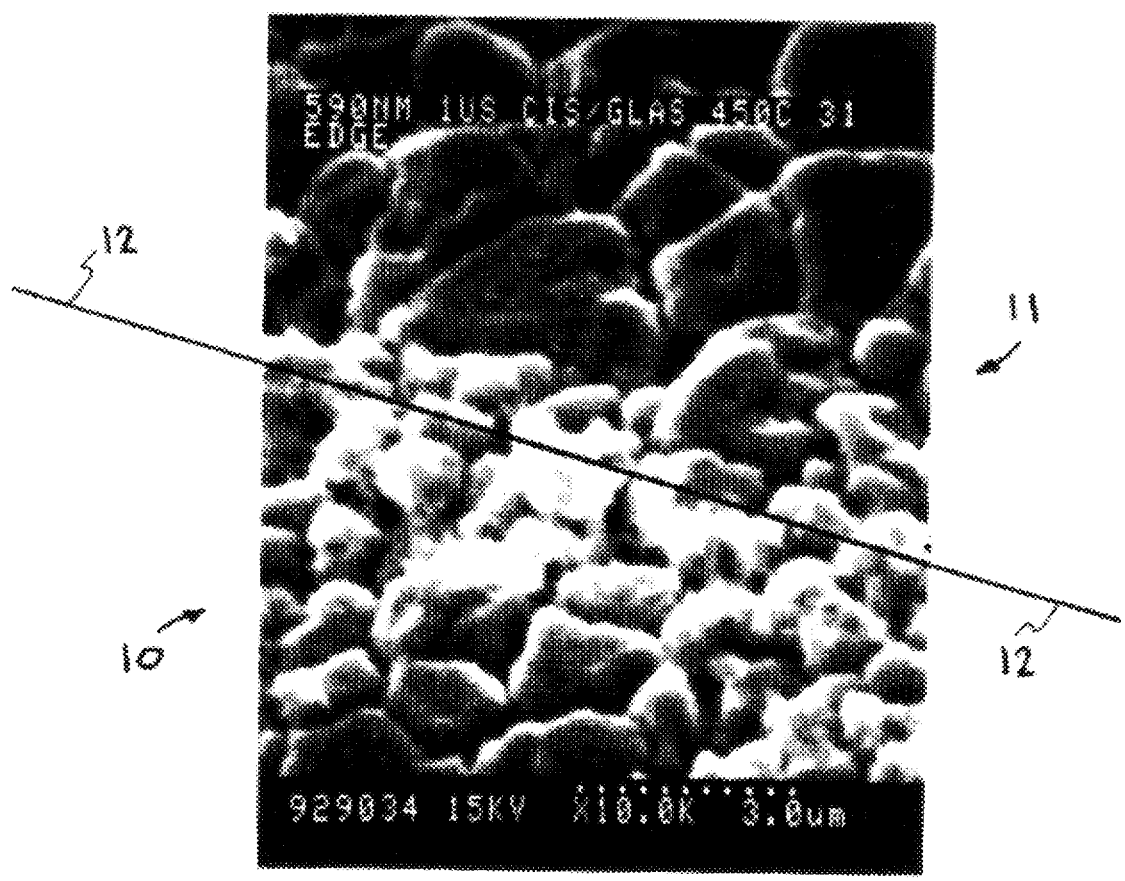

FABRICATION OF POLYCRYSTALLINE THIN FILMS BY PULSED LASER PROCESSING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the fabrication of material for use in solar cells; particularly to reducing the cost and weight of the substrates used in solar cell fabrication, while maintaining, or improving, efficiency; and more to a method for fabricating polycrystalline thin films using low-temperature and high-temperature substrates via pulsed laser processing.

The formation of high quality polycrystalline semiconducting films for solar cells generally requires deposition, doping, or annealing temperatures that are high enough to prohibit the use of many substrates. Substrates which can endure these processing temperatures are more expensive and this increases the cost of fabrication. Two key factors which determine the utility of solar cells for many applications are cost and weight. The cost and weight of many polycrystalline solar cells can be driven by the cost and weight of the substrate and/or superstrate onto which the solar cell is fabricated. Many low cost and lightweight substrates and/or superstrates are assumed to be impractical for solar cells because they cannot be exposed to the high temperatures required for the deposition, annealing, or doping of high quality solar cells.

This problem has been circumvented by the present invention wherein all deposition steps are performed at temperatures which are sufficiently low to avoid damage to the substrate and/or superstrate. After deposition, select layers of the partially fabricated material are transiently heated with at least one pulse of a laser, with the pulse length selected to allow recrystallization and/or dopant activation while maintaining the substrate at low temperature. Thus, the present invention enables use of low-temperature or high-temperature substrates and/or superstrates, such as in the fabrication of high quality solar cells. Pulsed laser processing at relatively low temperatures increases the grain or crystal size of the deposited materials.

SUMMARY OF THE INVENTION

An object of the present invention is to provide a method for fabricating thin films using pulsed laser processing.

A further object of the invention is to provide a method for fabricating thin films for use in solar cells, using low-temperature or high-temperature substrates and/or superstrates.

A further object of the invention is to provide a method for fabrication of polycrystalline thin films or use in solar cells on low-temperature substrates.

Another object of the invention is to reduce the cost and weight of solar cells by using low-temperature substrates and/or superstrates, and by using low deposition temperatures and pulsed laser processing so as not to damage the substrate/superstrate.

Another object of the invention is to provide a method for fabricating polycrystalline thin films for such as the fabrication of solar cells using low- or high-temperature substrates/superstrates, low-temperature deposition, and transient heating via pulsed laser processing which allow recrystallization and/or dopant activation without damage to the substrates/superstrates.

Other objects and advantages of the invention will become apparent from the following description and accompanying drawing. Basically, the present invention involves the fabrication of material for use in solar cells using low-temperature and high-temperature substrates and/or superstrates, depositing one or more thin films on the substrate/superstrate at low-temperatures, and thereafter transiently heating select layers of the thus formed material with at least one pulse of laser energy or other homogenized beam source, with the pulse length selected to allow recrystallization and/or dopant activation while maintaining the substrate/superstrate at a temperature which is sufficiently low to avoid damage thereto. Experimental verification has shown that pulsed laser processing increases the grain or crystal size of the deposited materials using lower than conventional processing temperatures.

This invention can be used to reduce the cost and the weight of solar cells by enabling the use of lighter weight and lower cost substrates. The reduction of weight of solar cells is particularly important for applications in high altitude long endurance (HALE) planes, satellites, terrestrial vehicles, and structures which are marginally supported prior to the addition of solar cells.

BRIEF DESCRIPTION OF THE DRAWINGS

The accompanying drawing, which is incorporated into and form a part of the disclosure, is a photograph of a before and after application of the invention, and together with the description, serve to explain the principles of the invention.

The single figure is an SEM photograph showing recrystallization of the material, with the lower portion as deposited and the upper portion after pulsed laser processing in accordance with the invention.

DETAILED DESCRIPTION OF THE INVENTION

The present invention is directed to the fabrication of polycrystalline material particularly applicable in solar cells, using low-temperature or high-temperature substrates and/or superstrates, thereby reducing the cost and/or the weight of the solar cells. As pointed out above, many low cost and lightweight substrates and/or superstrates are assumed to be impractical for solar cells because they cannot be exposed to the high temperatures required for the deposition, annealing, or doping of high quality solar cells. Since the method of this invention is of importance to the fabrication of solar cells, the description is directed to solar cell fabrication, but can be used in other applications.

The present invention involves a process or method of fabricating polycrystalline material whereby all deposition steps are carried out at temperatures which are sufficiently low to avoid damage to the substrate and/or superstrate, and thereafter transiently heating select layers of the thus deposited material with at least one pulse of a laser or other homogenized beam source. The pulse length is selected so that the layer(s) of interest are transiently heated to a temperature which allows recrystallization and/or dopant activation while maintaining the substrate or superstrate at a temperature which is sufficiently low to avoid damage thereto. During both deposition (formation) of the layer and subsequent pulsed laser heat treatment, the temperature limit of the substrate should not be exceeded for periods greater than 100 μs.

This invention thus enables the use of either high-temperature substrates or low-temperature, inexpensive, and lightweight substrates in the manufacture of solar cells. Certain substrates and or superstrates are composed of a plastic incapable of withstanding sustained processing temperatures of higher than about 180° C. and sustained processing time periods of longer than about $10^5$ ns (100 µs), referred to herein as low-temperature substrates, compared to substrates of silicon or the so called high-temperature silicon, plastic or polymeric materials such as KAPTON, manufactured by Dupont Corporation, which can withstand up to about 400°–450° C. and longer processing time periods, referred to herein as high-temperature substrates. Examples of the low-temperature substrate materials include ethylene-chlorotrifluoroethylene (E-CTFE), ethylene-tetrafluoroethylene (E-TFE), polyethersulfone (PES), polyvinylidene fluoride (PVDF), poly-tetra-fluoro-ethylene (PTFE), fiberglass enhanced plastic (FEP) and high density poly-ethylene (HDPE).

Thin films of selected material, such as copper-indium-selenium (CuInSe), amorphous-silicon (a-Si), gallium-arsenic (GaAs), cadmium-tellurium (CdTe), copper-indium-sulfur (CuInS), or cadmium-sulfur (CdS), utilized in the fabrication of solar cells may, for example, be deposited on the low-temperature substrates and/or superstrates by sputtering, evaporation, or other known deposition techniques which can be carried out at room temperature or temperatures not to exceed about 100°–150° C., so as to not cause sustained (greater than 100 µs) heating of the substrate/superstrate to a temperature of greater than about 180° C. Where high-temperature substrates are used, longer sustained processing times and temperatures may be issued.

The thus deposited thin films are then subjected to at least one pulse of laser or other homogenized beam source, such as a flashlamp-pumped Ti:Sapphire laser, a flashlamp-pumped dye laser, an XeCl, KrF or ArF excimer laser, e-beams, flashlamp, etc. operating at a wavelength in the range of about 197–1100 nm which produce sufficient energy to transiently heat select thin films or layers which allows recrystallization and/or dopant activation, without increasing the temperature of the substrate above the critical temperature for a sustained period of time. The critical temperature is defined as about 180° C. for the low-temperature substrates and about 450° C. for the high-temperature substrates.

Dopants can be added to the deposited thin films during the laser processing step via gas immersion techniques. For example, boron or phosphorous doped crystalline regions may be formed via laser irradiation of the thin films in an atmosphere containing boron trifluoride ($BF_3$) or phosphorous pentafluoride ($PF_5$). In addition, semiconductor, metal, or insulator films may be deposited by using appropriate carrier gases. A comprehensive list of such gases is set forth in "Laser-Assisted Deposition of Thin Films from Gas-Phase and Surface-Adsorbed Molecules", I. P. Herman, Chem. Rev. 1989, 89, pp. 1323–1357. These films can be used to alter the stoichiometry of surface layers, form heterojunctions, or form well sintered contacts. For example, where the thin film deposited on the substrate is CdTe, a thin (a few hundred Å) layer or film of CdS may be deposited in an inert or selected environment. Alternatively, Cd or Te containing gases may be used to alter the Cd:Te ratio near the surface.

Proof-of-principle experiments were carried out to show that a selected material deposited at low temperatures could be recrystallized using pulsed laser energy processing to verify the formation of larger crystals and thus higher solar cell efficiency. In these proof-of-principle experiments, thin films deposited at low temperatures on low-temperature substrates were irradiated with pulse laser energy to verify that laser processing did not damage the substrates due to excessive heating via excessive processing times. Since the process of this invention has been verified using low-temperature substrates, it can be readily utilized on high-temperature substrates.

The proof-of-principle experiments that pulsed laser processing of material deposited at low-temperature generated larger crystals as seen in the Figure which constitutes an SEM photograph showing a sample or copper-indium-selenium (CuInSe) deposited at low-temperature and irradiated by a laser pulse. The lower portion of the figure indicated at 10 shows the CuInSe as deposited (grain size ~0.5–1 µm), while the upper portion indicated at 11 shows the CuInSe after processing with a single laser pulse of ~1 $J/cm^2$ (grain size ~2–4 µm), with a line 12 separating the lower and upper portions, 10 and 11. The proof-of-principle experiments were carried out using a flashlamp-pumped dye laser capable of generating spatially homogenized pulses of ~1 µs duration, 590 nm wavelength, and up to ~10 $J/cm^2$ at the substrate. Samples used were partially processed solar cells which consisted of copper-indium-selenium deposited on glass (a high-temperature substrate) with and without a molybdenum (Mo) buffer layer, the CuInSe being deposited at ~400° C. and ~550° C. The CuInSe layer was ~3 µm thick in each sample and the high-temperature samples were typical of that required for optimal high efficiency solar cell material (~550° C.), while the lower temperature samples were typical of the highest temperature feasible for the so-called high-temperature plastic solar cell substrates (~450° C.). These experiments illustrated that laser processing of a material deposited at a lower temperature causes recrystallization thereof which results in larger grain size material, which is of essentially the same grain size as material deposited at the higher temperature (~550° C.) for optimal high efficiency solar cell material.

With proof-of-principle experiments verifying that recrystallization using pulsed laser energy results in large crystal grain size material for high solar cell efficiency, experiments were then carried out to verify that material deposited at low temperature on the so called low-temperature plastic substrates, and then irradiated by pulsed laser energy would not damage the substrates. These experiments were carried out by depositing thin films (0.5–1 µm) of amorphous silicon (a-Si) on a low-temperature polymeric substrate composed of ethylene-chlorotrifluoroethylene (E-CTFE), made under the trademark HALAR by Ausimont U.S.A., Inc., and using pulses from an XeCl excimer laser (308 nm) to selectively recrystallize areas in the a-Si films to produce polycrystalline and microcrystalline films. The a-Si/plastic substrate samples were exposed to pulsed laser radiation in three different environments, vacuum (<1 mT), $BF_3$ (50T), and $PF_5$(50T), wherein the XeCl laser produced 30 ns (FNHM) pulses of 308 nm light totally approximately 1 joule per pulse. This process produced crystal sizes ranging from a few to hundreds of nanometers (nm) with no detectable damage to the low-temperature plastic substrate found.

A significant advantage of pulsed laser processing is that high (>900° C.), localized processing temperatures can be achieved in thin films, with little accompanying temperature rise in the substrate. Pulsed laser processing typically entails applying short (10–$10^5$ ns) pulses of laser energy (0.1–1.0 $Jcm^{-2}$) to thin films such as a-Si, CuInSe, GaAs, CuInS, CdS, and CdTe, used in solar cells, in vacuum or gaseous atmosphere, whereby undoped or doped thin film material is recrystallized forming a higher efficiency solar cell.

One of the advantages of using inexpensive, low-temperature and certain high-temperature substrates and/or superstrates is that such are lighter in weight than the conventionally used, so called high-temperature substrates. For example, the areal weight of a lightweight plastic substrate made of a polymer with density of ~1.4 g/cc, having a thickness of 1 mil (25 μm), is 3.5 mg/cm$^2$, compared to a rigid glass substrate with a density of 2.2 g/cc and a thickness of ~20 mil (500 μm) is 110 mg/cm$^2$. A composite, composed of expensive glass (~3 mil) on thin Si (4 mil) with an adhesive (1 mil) is still an order of magnitude higher areal weight than the lightweight plastic substrate. Thus, this invention substantially reduces the weight of the substrate, while providing the desired large crystal sizes.

It has thus been shown that the present invention provides a method for pulsed energy processing which can be utilized for thin film recrystallization and/or dopant activation, without adverse temperature increases in the substrate, where the thin film is deposited on the substrate at a low temperature. It has also been shown that the present invention enables the use of low-temperature, low cost, lightweight substrates/superstrates, as well as high-temperature substrates, in the fabrication of high efficiency solar cells. Thus, this invention provides a method for reducing the cost and weight of solar cells using polycrystalline thin films.

While the invention has been described with specific uses, materials, laser energies and wavelengths, times, parameters, etc., such is not intended to be limiting. Modifications and changes will become apparent, and it is intended that the invention only be limited by the scope of the appended claims.

We claim:

1. A method for fabricating polycrystalline thin films including the steps of:

forming a film of material on a substrate in a time period such that the temperature of the substrate is not raised above a temperature of about 450° C. for a time period greater than about 100 μs; and irradiating at least a portion of the thus formed film with at least one energy pulse to cause heating and recrystallization of at least a portion of the material of the film in a time period such that the temperature of the substrate is not raised above a temperature of about 180° C. for said time period of greater than about 100 μs.

2. The method of claim 1, wherein the energy pulse is produced by a homogenized beam source selected from the group of dye lasers, excimer lasers, flashlamp-pumped lasers, and electron-beams.

3. The method of claim 2, wherein the homogenized beam source has the capability of applying up to about 100 μs pulses of 01.1–10 Jcm$^{-2}$ energy to the film of material.

4. The method of claim 1, additionally including the step of forming the substrate from a material incapable of withstanding processing temperatures of higher than about 180° C. for longer than about 100 μs.

5. The method of claim 4, wherein said substrate is formed from low-temperature materials selected from the group consisting of E-CTFE, E-TFE, PES, PVDF, PTFE, FFP, and HDPE.

6. The method of claim 1, additionally including the step of providing dopant gases during the step of irradiation of the film, thereby producing a doped film.

7. The method of claim 1, additionally including the step of providing the film of material with semiconductor or component gases to control stoichiometry of semiconductor materials or to produce heterojunctions.

8. The method of claim 1, additionally including the step of providing the film of material with a metal containing gas to help form a contact.

9. A method for fabricating thin films for use in solar cells, including the steps of:

forming at least one film of material on a substrate at a temperature of not greater than about 450° C.; and directing at least one pulse of laser radiation onto at least a portion of the at least one film for causing recrystallization and increased crystal grain size of the film material without raising the temperature of the substrate above about 180° C. for longer than about 100 μs.

10. The method of claim 9, wherein the at least one film of material was formed to a thickness of not greater than about 10 μm.

11. The method of claim 10, wherein the at least one film is formed from material selected from the group of amorphous silicon, cadmium-tellurium, copper-indium-selenium, gallium-arsenic, copper-indium-sulfur, and cadmium-sulfur.

12. The method of claim 11, wherein the at least one pulse of laser energy was produced by a laser selected from the group of dye, excimer, and flashlamp-pumped lasers, capable of producing a homogenized beam of up to about 100 μs duration with an energy of up to about 0.1–10 Jcm$^{-2}$ to the film material.

13. The method of claim 12, wherein the laser is a flashlamp-pumped dye laser, wherein the film of material is of copper-indium-selenium, and wherein the crystal grain size is increased from about 0.5–1 μm to about 2–4 μm by irradiation from the laser pulse.

14. The method of claim 12, wherein the laser is a flashlamp-pumped Ti:sapphire laser, and wherein the film of material is of cadmium-tellurium.

15. The method of claim 12, wherein the laser is an XeCl excimer laser, wherein the film of material is of amorphous silicon, and wherein the amorphous silicon is crystallized by the laser pulse to form polycrystalline or microcrystalline silicon.

16. The method of claim 9, wherein the at least one pulse of laser radiation is produced by a laser operating at a wavelength in the range of about 197–1100 nm, and capable of producing pulses of up to about 100 μs and energy of up to about 10 Jcm$^{-2}$ to the film of material.

17. The method of claim 9, wherein the substrate is selected from the group of low-temperature materials consisting of E-CTFE, E-TFE, PES, PVDF, PTFE, FFP, and HDPE, and wherein the at least one film is formed on the substrate at a temperature of less than about 180° C.

18. Polycrystalline thin films formed by the method of claim 1.

* * * * *